United States Patent
Yu

(10) Patent No.: US 7,505,274 B2
(45) Date of Patent: Mar. 17, 2009

(54) HEAT SINK FASTENING DEVICE AND ASSEMBLING PROCESS THEREOF

(75) Inventor: Wen-Lung Yu, Taoyuan Hsien (TW)

(73) Assignee: Delta Electronics, Inc., Taoyuan Hsien (TW)

(*) Notice: Subject to any disclaimer, the term of this patent is extended or adjusted under 35 U.S.C. 154(b) by 295 days.

(21) Appl. No.: 11/555,498

(22) Filed: Nov. 1, 2006

(65) Prior Publication Data
US 2008/0055862 A1 Mar. 6, 2008

(30) Foreign Application Priority Data
Sep. 6, 2006 (TW) ............... 095132949

(51) Int. Cl.
*H05K 7/20* (2006.01)
(52) U.S. Cl. ............... 361/710; 361/704; 361/707; 257/718; 257/719; 165/80.3
(58) Field of Classification Search ............... 361/704, 361/707, 710, 720; 257/E23.084, 718–719, 257/722; 165/185, 80.3; 174/16.3
See application file for complete search history.

(56) References Cited

U.S. PATENT DOCUMENTS

| | | | | | |
|---|---|---|---|---|---|
| 4,204,248 | A | * | 5/1980 | Proffit et al. ............... | 361/707 |
| 4,638,404 | A | * | 1/1987 | Grossmann et al. ......... | 361/710 |
| 5,184,281 | A | * | 2/1993 | Samarov et al. ............ | 361/704 |
| 5,191,512 | A | * | 3/1993 | Ogura et al. ............... | 361/720 |
| 5,343,362 | A | * | 8/1994 | Solberg ..................... | 361/710 |
| 5,844,312 | A | * | 12/1998 | Hinshaw et al. ............. | 257/718 |
| 5,991,151 | A | * | 11/1999 | Capriz ........................ | 361/704 |
| 6,068,051 | A | * | 5/2000 | Wendt ........................ | 165/185 |
| 6,180,874 | B1 | * | 1/2001 | Brezina et al. ............. | 174/16.3 |
| 6,195,257 | B1 | * | 2/2001 | Janicek et al. ............. | 361/704 |
| 6,252,773 | B1 | * | 6/2001 | Werner ...................... | 361/704 |
| 6,304,449 | B1 | * | 10/2001 | Zhang ........................ | 361/704 |
| 6,350,634 | B2 | * | 2/2002 | Ma ............................ | 438/122 |
| 6,735,084 | B1 | * | 5/2004 | Choi et al. .................. | 361/704 |
| 7,185,696 | B2 | * | 3/2007 | Schaper ..................... | 165/80.2 |
| 7,330,355 | B2 | * | 2/2008 | Kuo et al. ................... | 361/707 |
| 7,417,862 | B2 | * | 8/2008 | Lo ............................. | 361/719 |
| 2003/0112602 | A1 | * | 6/2003 | Lin ............................ | 361/707 |
| 2007/0085763 | A1 | * | 4/2007 | Jeong ........................ | 345/60 |

* cited by examiner

*Primary Examiner*—Jayprakash N Gandhi
*Assistant Examiner*—Courtney L Smith
(74) *Attorney, Agent, or Firm*—Kirton & McConkie; Evan R. Witt

(57) ABSTRACT

A heat sink fastening device is used for facilitating fixing a heat sink on a circuit board. The heat sink fastening device includes a first connecting portion, a second connecting portion and at least a connecting member. The first connecting portion is included in the circuit board. The second connecting portion is included in the heat sink. The connecting member is disposed on a first surface of the circuit board and includes a first connecting part and a second connecting part. The first connecting part is coupled to the first connecting portion of the circuit board and the second connecting part is coupled to the second connecting portion of the heat sink, thereby facilitating fixing the heat sink on the first surface of the circuit board.

20 Claims, 8 Drawing Sheets

S31 — Provide a circuit board including a first surface, a second surface and a first connecting portion, and couple a first connecting part of a connecting member to the first connecting portion of the circuit board.

S32 — Place several electronic components on the first surface of the circuit board, and heat these electronic components and the circuit board in a reflow furnace so as to bond the electronic components onto the circuit board.

S33 — Couple the second connecting portion of the heat sink to the second connecting part of the connecting member, thereby fixing the heat sink on the circuit board.

Fig. 7

HEAT SINK FASTENING DEVICE AND ASSEMBLING PROCESS THEREOF

FIELD OF THE INVENTION

The present invention relates to a heat sink fastening device, and more particularly to a heat sink fastening device for facilitating fixing a heat sink on a circuit board. The present invention also relates to a process of assembling a heat sink by using such a heat sink fastening device.

BACKGROUND OF THE INVENTION

When an electronic device operates, the electronic components on the printed circuit board thereof may generate energy in the form of heat, which is readily accumulated around the circuit board and difficult to dissipate away. If no proper heat-dissipating mechanism is provided to transfer enough heat to the ambient air, the elevated operating temperature may result in damage of the electronic components, a breakdown of the whole electronic device or reduced operation efficiency. Therefore, it is important to dissipate the heat generated from the electronic components in order to stabilize the operation and extend the operational life of the electronic device.

For example, a heat sink is fixed onto a surface of the circuit board of a power supply apparatus. By means of the heat sink, the heat generated from the electronic components on the circuit board is transferred to the ambient air. Since the heat sink is developed toward increased heat transfer area and reduced thermal resistance, it is important to provide a process of assembling the heat sink in a simplified manner.

Referring to FIG. 1(a), a schematic layout configuration of a circuit board within a conventional power supply apparatus is illustrated. As shown in FIG. 1(a), the circuit board 10 includes a first surface 10a and a second surface 10b, which are opposed to each other. Several electronic components 11 are mounted on the first surface 10a of the circuit board 10. The electronic components 11 include for example at least a transistor, at least a resistor, at least a capacitor, at least a diode, at least a magnetic elements and the like. The power converting circuit cooperatively defined by these electronic components 11 and the trace pattern of the circuit board 10 is responsible for power conversion. In addition, at least one heat sink 12 is fixed on the first surface 10a of the circuit board 10 for dissipating heat generated from the electronic components 11. For increasing heat transfer area and reducing thermal resistance, the heat sink 12 is an aluminum extrusion element having an L-shaped or T-shaped cross-section. Take an L-shaped cross-sectional heat sink 12 for example. The heat sink 12 principally comprises a first part 121 and a second part 122, which are perpendicular to each other. The first part 121 of the heat sink 12 is supported on the first surface 10a of the circuit board 10. The second part 122 of the heat sink 12 is extended from the upper edge of the first part 121 and substantially parallel with the circuit board 10 such that a space 13 is formed between the second part 122 and the circuit board 10. Some high power electronic components 11, e.g. transistors, may be fastened onto the first part 121 of the heat sink 12 in order to increase heat-dissipating efficiency.

Please refer to FIG. 1(b), which is a partial schematic cross-sectional view of the circuit board shown in FIG. 1(a). The circuit board 10 has a perforation 10c. The bottom 123 of the first part 121 of the heat sink 12 has a groove 124 corresponding to the perforation 10c of the circuit board 10. The groove 124 and the perforation 10c have inner threads formed on the inner wall thereof. For coupling the heat sink 12 with the circuit board 10, a screw 14 is penetrated through the perforation 10c of the circuit board 10 and then screwed in the groove 124 such that the external thread of the screw 14 is engaged with the inner thread of the groove 124. The pins 11a of the high power electronic components 11, which are fastened onto the first part 121 of the heat sink 12, are inserted into corresponding via holes 10d of the circuit board 10. After the molten solder paste is applied on the peripheries of these via holes 10d, the pins 11a are welded onto the circuit board 10. Since the heat sink 12 is an aluminum extrusion element having an L-shaped or T-shaped cross-section, the center of gravity of the heat sink 12 is shifted from the center line thereof. In other works, the heat sink 12 fails to be firmly secured onto the circuit board 10 by screwing into the groove and welding the pins. If the power supply apparatus is suffered from a drop or a strong impact, shear stresses may be exerted on the contact portions between the screw 14 and the circuit board 10 and/or between the pins 11a and the circuit board 10. Due to these shear stresses, the heat sink 12 is readily detached from the circuit board 10.

Hereinafter, a process of fixing the heat sink on the circuit board will be illustrated with reference to FIG. 2 and also FIGS. 1(a) and 1(b). Firstly, a circuit board 10 including a first surface 10a and a second surface 10b is provided (Step S11). Then, the circuit board 10 is turned over. A screw 14 is penetrated through the perforation 10c of the circuit board 10 and then screwed in the groove 124 of the first part 121 of the heat sink 12 such that the external thread of the screw 14 is engaged with the inner thread of the groove 124, thereby fixing the heat sink 12 on the circuit board 10 (Step S12). The circuit board 10 is turned back. Then, several electronic components 11 constituting a power converting circuit are disposed on the first surface 10a of the circuit board 10 such that a space 13 is formed between the second part 122 and the circuit board 10 (Step S13). Afterwards, these electronic components 11 and the circuit board 10 are heated in a reflow furnace to melt the solder paste. The circuit board 10 is then cooled to solidify the solder paste so as to bond the electronic components 11 onto the circuit board 10 (Step S14). Since the space 13 between the second part 122 of the heat sink 12 and the circuit board 10 becomes hindrance from mounting the electronic components 11, this assembling process is time-consuming and troublesome.

Hereinafter, another process of fixing the heat sink on the circuit board will be illustrated with reference to FIG. 3 and also FIGS. 1(a) and 1(b). Firstly, a circuit board 10 including a first surface 10a and a second surface 10b is provided (Step S21). Then, several electronic components 11 constituting a power converting circuit are disposed on the first surface 10a of the circuit board 10, and these electronic components 11 and the circuit board 10 are heated in a reflow furnace to melt the solder paste so as to bond the electronic components 11 onto the circuit board 10 (Step S22). Then, the circuit board 10 is turned over. A screw 14 is penetrated through the perforation 10c of the circuit board 10 and then screwed in the groove 124 of the first part 121 of the heat sink 12 such that the external thread of the screw 14 is engaged with the inner thread of the groove 124, thereby fixing the heat sink 12 on the circuit board 10 (Step S23). The circuit board 10 is turned back. Afterwards, the pins 11a of the high power electronic components 11 are inserted into corresponding via holes 10d of the circuit board 10 and then the main bodies of the high power electronic components 11 are fastened onto the first part 121 of the heat sink 12. Then, these electronic components 11 and the circuit board 10 are heated in the reflow furnace again so as to bond the pins 11a onto the circuit board 10 (Step S24). As known, the procedures of turning over and turning back the circuit board 10 are troublesome. In addition, the procedures of successively inserting the pins 124b into these via holes 10d are labor-intensive and time-consuming.

In views of the above-described disadvantages resulted from the prior art, the applicant keeps on carving unflaggingly to develop a heat sink fastening device for facilitating fixing a heat sink on a circuit board according to the present invention through wholehearted experience and research.

SUMMARY OF THE INVENTION

It is an object of the present invention to provide a heat sink fastening device for facilitating fixing a heat sink on a circuit board.

Another object of the present invention is to provide a process of assembling a heat sink in a simplified manner by using such a heat sink fastening device.

In accordance with an aspect of the present invention, there is provided a heat sink fastening device for facilitating fixing a heat sink on a circuit board. The circuit board includes a first surface and a second surface. Plural electronic components are mounted on the first surface of the circuit board. The heat sink includes a first part and a second part, wherein the second part of the heat sink is extended from an edge of the first part. The heat sink fastening device includes a first connecting portion, a second connecting portion and at least a connecting member. The first connecting portion is included in the circuit board. The second connecting portion is included in the heat sink. The connecting member is disposed on the first surface of the circuit board and includes a first connecting part and a second connecting part. The first connecting part is coupled to the first connecting portion of the circuit board and the second connecting part is coupled to the second connecting portion of the heat sink, thereby facilitating fixing the heat sink on the first surface of the circuit board.

In accordance with another aspect of the present invention, there is provided a process of assembling a heat sink on a circuit board. Firstly, a circuit board including a first surface, a second surface and a first connecting portion is provided. A connecting member is disposed on the first surface of the circuit board and includes a first connecting part and a second connecting part, wherein the first connecting part of the connecting member is coupled to the first connecting portion of the circuit board. Then, plural electronic components are mounted on the circuit board, and the electronic components and the circuit board are heated in a reflow furnace, thereby bonding the electronic components onto the circuit board. Afterwards, a heat sink including a second connecting portion is provided, and the second connecting portion of the heat sink is coupled to the connecting part of the connecting member, thereby facilitating fixing the heat sink on the first surface of the circuit board.

The above contents of the present invention will become more readily apparent to those ordinarily skilled in the art after reviewing the following detailed description and accompanying drawings, in which:

BRIEF DESCRIPTION OF THE DRAWINGS

FIG. 7 is a flowchart of another process for assembling a heat sink on a circuit board according to the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
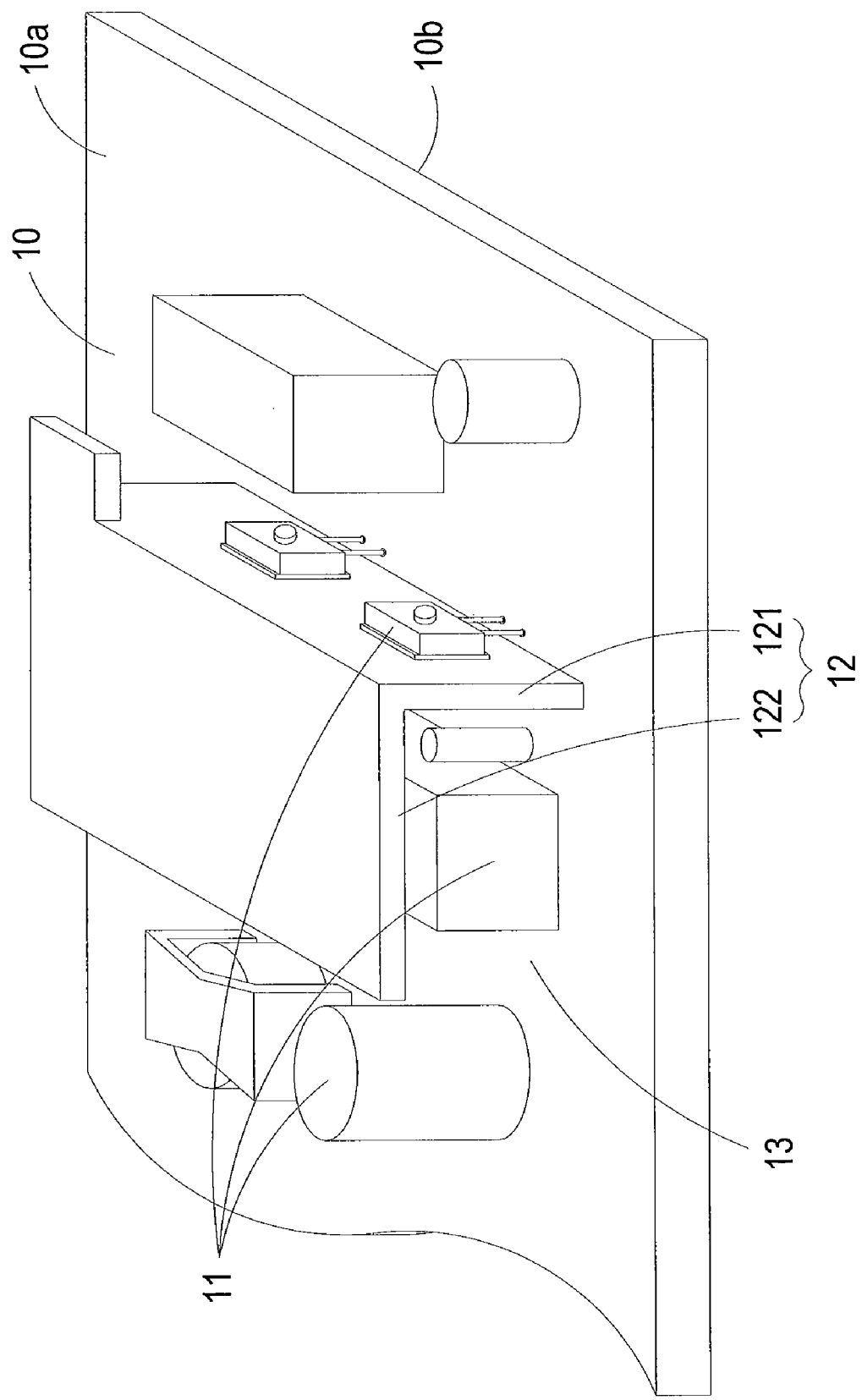
FIG. 1(a) is a schematic view illustrating a layout configuration of a circuit board.
Figure 1B:
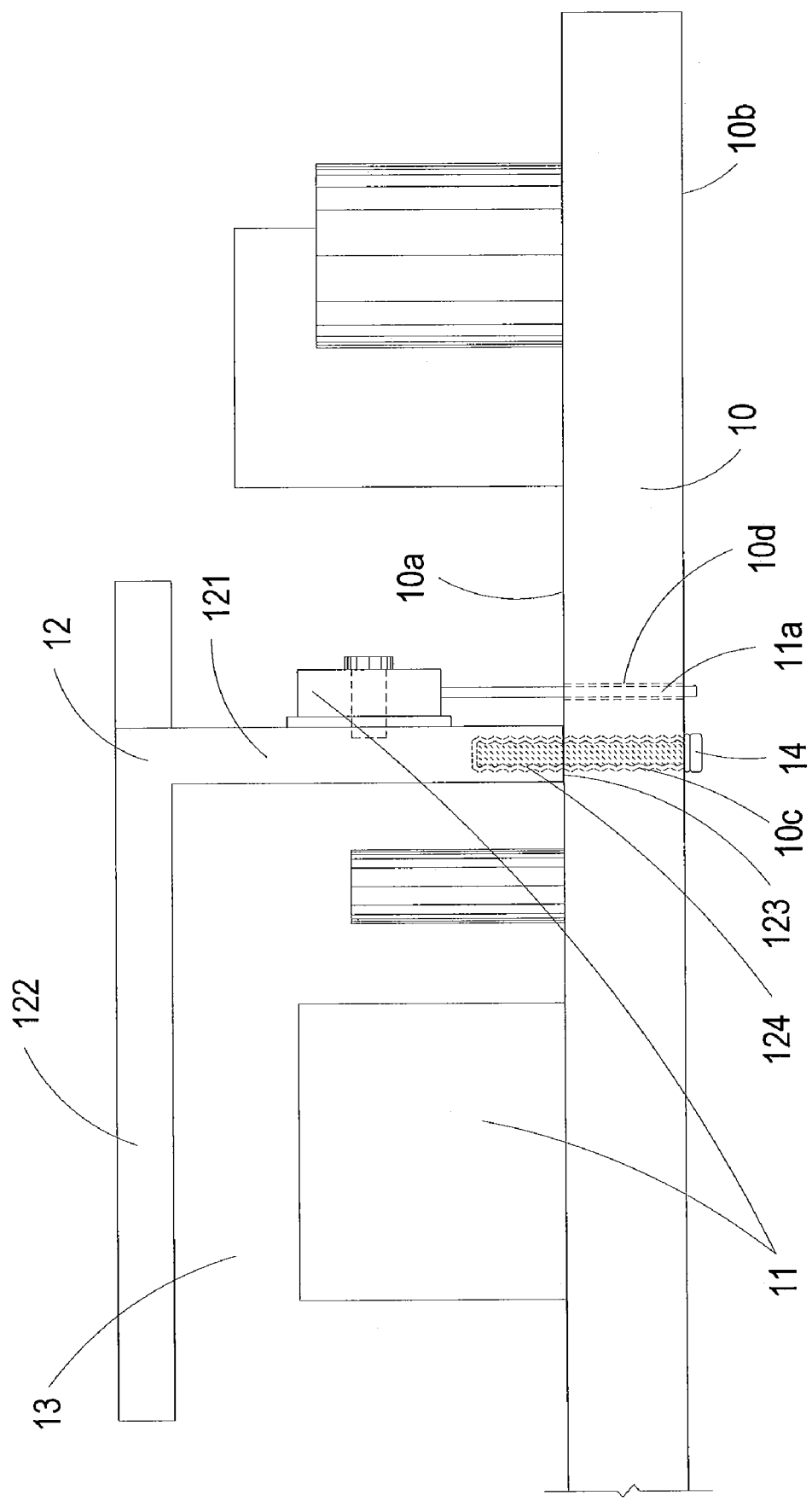
FIG. 1(b) is a partial schematic cross-sectional view of the circuit board shown in FIG. 1(a)
Figure 2:
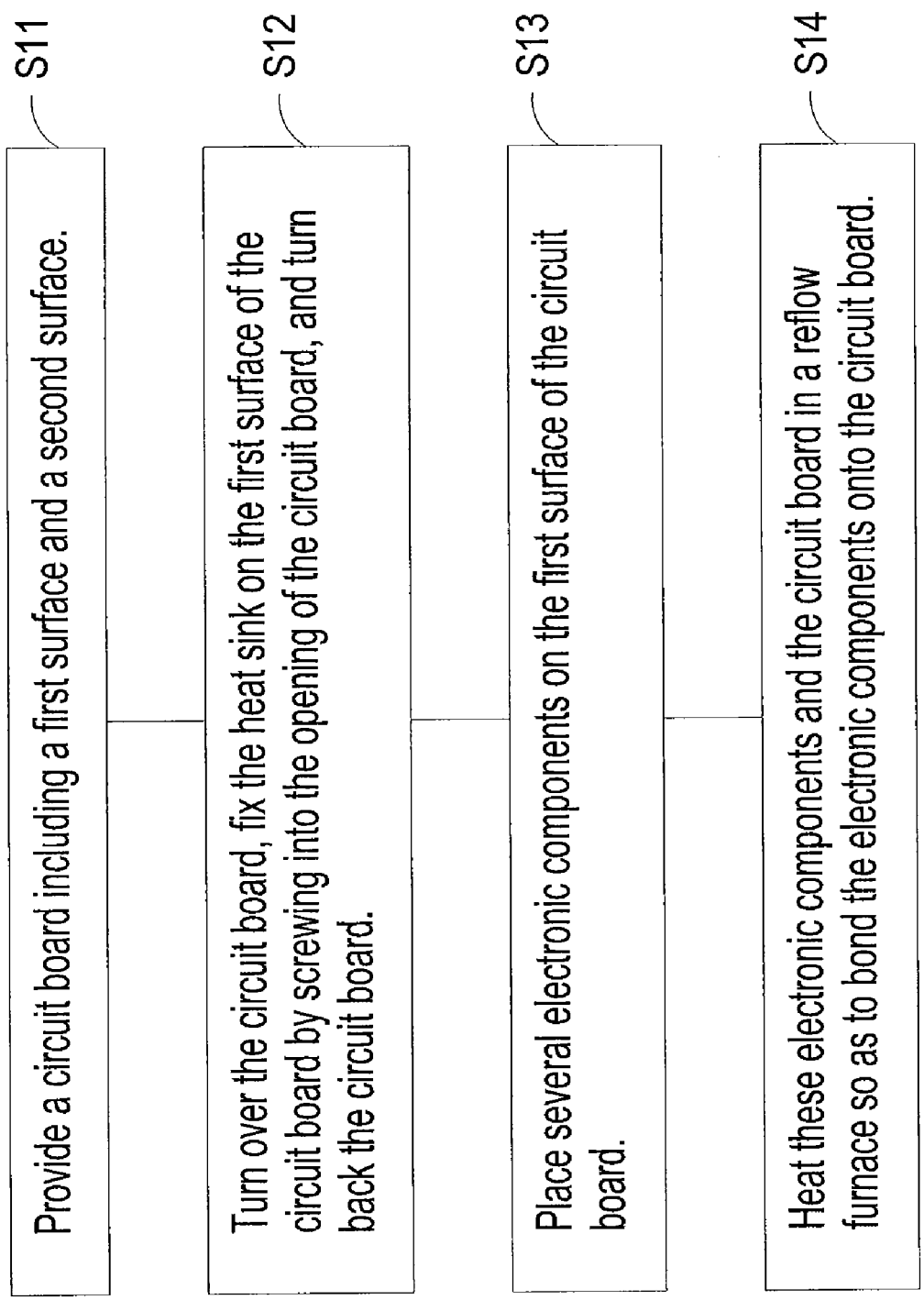
FIG. 2 is a flowchart of a process for assembling a heat sink on a circuit board according to prior art.
Figure 3:
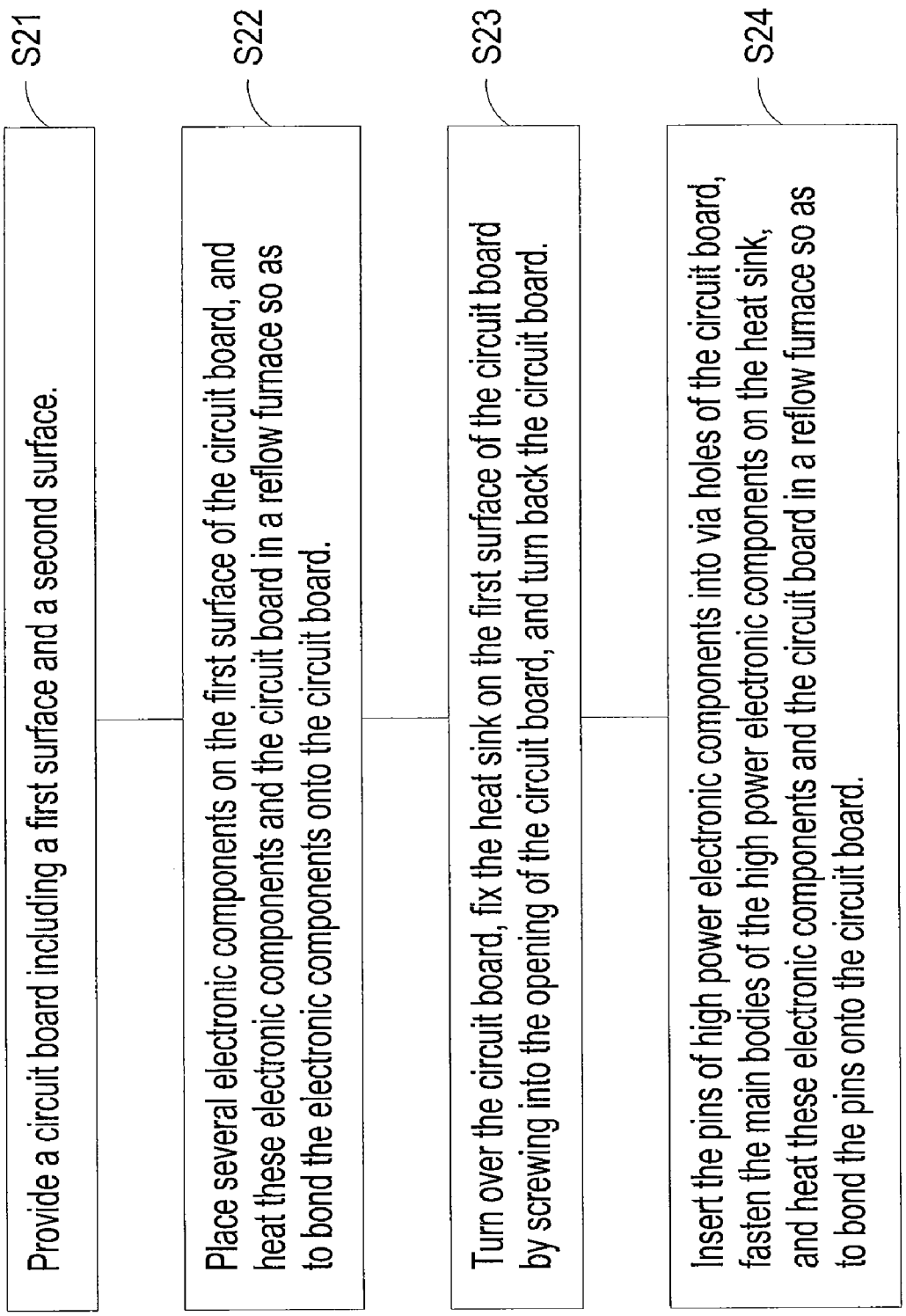
FIG. 3 is a flowchart of another process for assembling a heat sink on a circuit board according to prior art.
Figure 4:
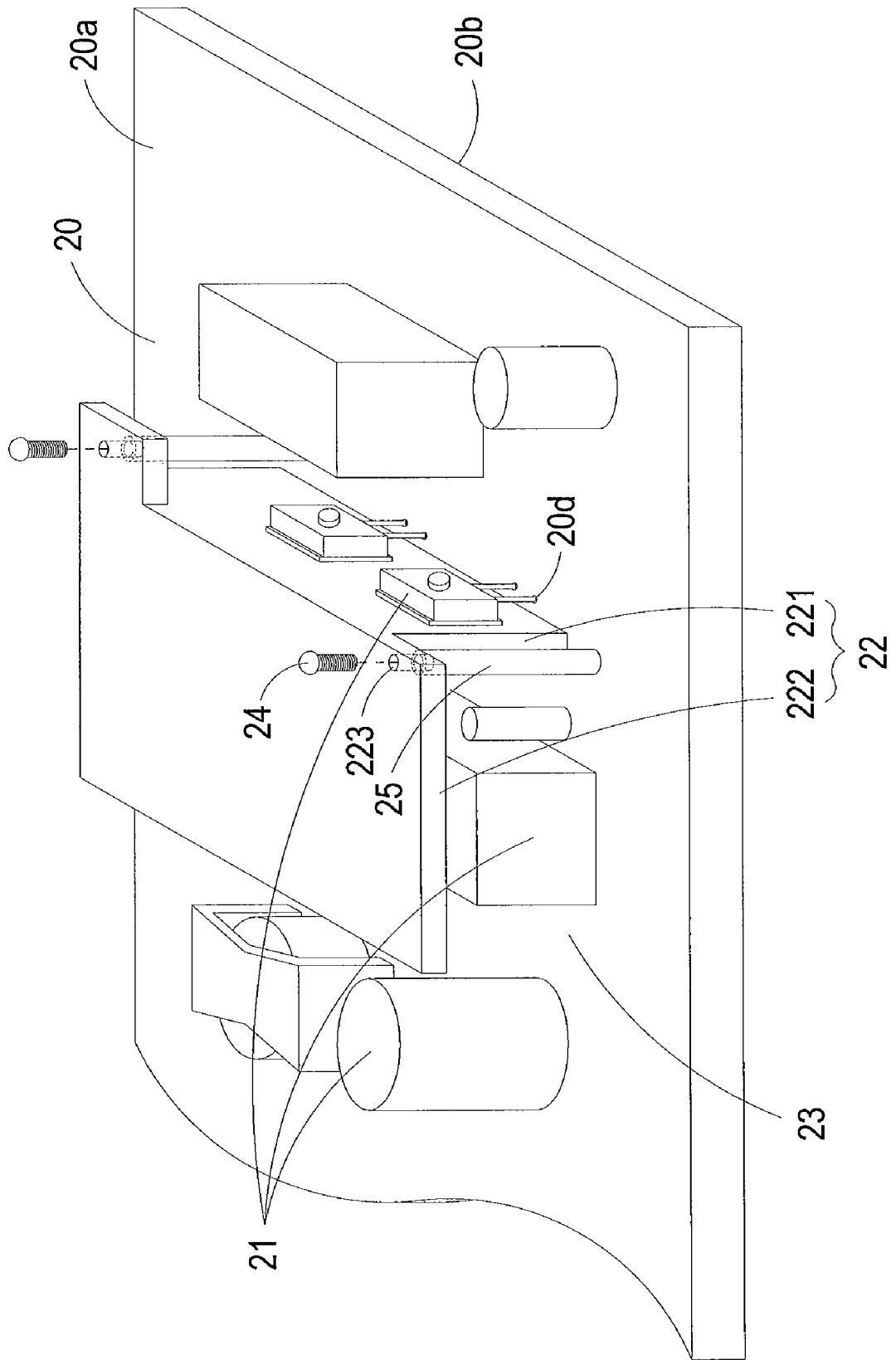
FIG. 4 is a schematic view illustrating a layout configuration of a circuit board according to a preferred embodiment of the present invention.

Referring to FIG. 4, a schematic layout configuration of a circuit board according to a preferred embodiment of the present invention is shown. As shown in FIG. 4, the circuit board 20 includes a first surface 20a and a second surface 20b, which are opposed to each other. Several electronic components 21 are mounted on the first surface 20a of the circuit board 20. The electronic components 21 include for example at least a transistor, at least a resistor, at least a capacitor, at least a diode, at least a magnetic elements and the like. The power converting circuit cooperatively defined by these electronic components 21 and the trace pattern of the circuit board 20 is responsible for power conversion. In addition, at least one heat sink 22 is fixed on the first surface 20a of the circuit board 20 for dissipating heat generated from the electronic components 21. For increasing heat transfer area and reducing thermal resistance, the heat sink 22 is an aluminum extrusion element having an L-shaped or T-shaped cross-section. Take an L-shaped cross-sectional heat sink 22 for example. The heat sink 22 principally comprises a first part 221 and a second part 222, which are perpendicular to each other. The first part 221 of the heat sink 22 is supported on the first surface 20a of the circuit board 20. The second part 222 of the heat sink 22 is extended from the upper edge of the first part 221 and substantially parallel with the circuit board 20 such that a space 23 is formed between the second part 222 and the circuit board 20. In some embodiments, the top surface of the second part 222 of the heat sink 22 is attached onto the inner wall of the housing (not shown) of the electronic device. Some high power electronic components 21, e.g. transistors, may be fastened onto the first part 221 of the heat sink 22 in order to increase heat-dissipating efficiency.

Please refer to FIG. 4 again. The heat sink fastening device is used for facilitating fixing the heat sink 20 on the circuit board 20 and principally includes a second connecting portion 223 of the heat sink 20, a fixing element 24 and a connecting member 25. The second connecting portion 223 is arranged at an edge of the second part 222 of the heat sink 22 and corresponding to the connecting member 25. For example, the second connecting portion 223 is a perforation and the fixing element 24 is a screw. The screw 24 is penetrated through the second connecting portion 223 and then coupled with the connecting member 25. Under this circumstance, the heat sink 22 is firmly fixed on the first surface 20a of the circuit board 20.

Figure 5:
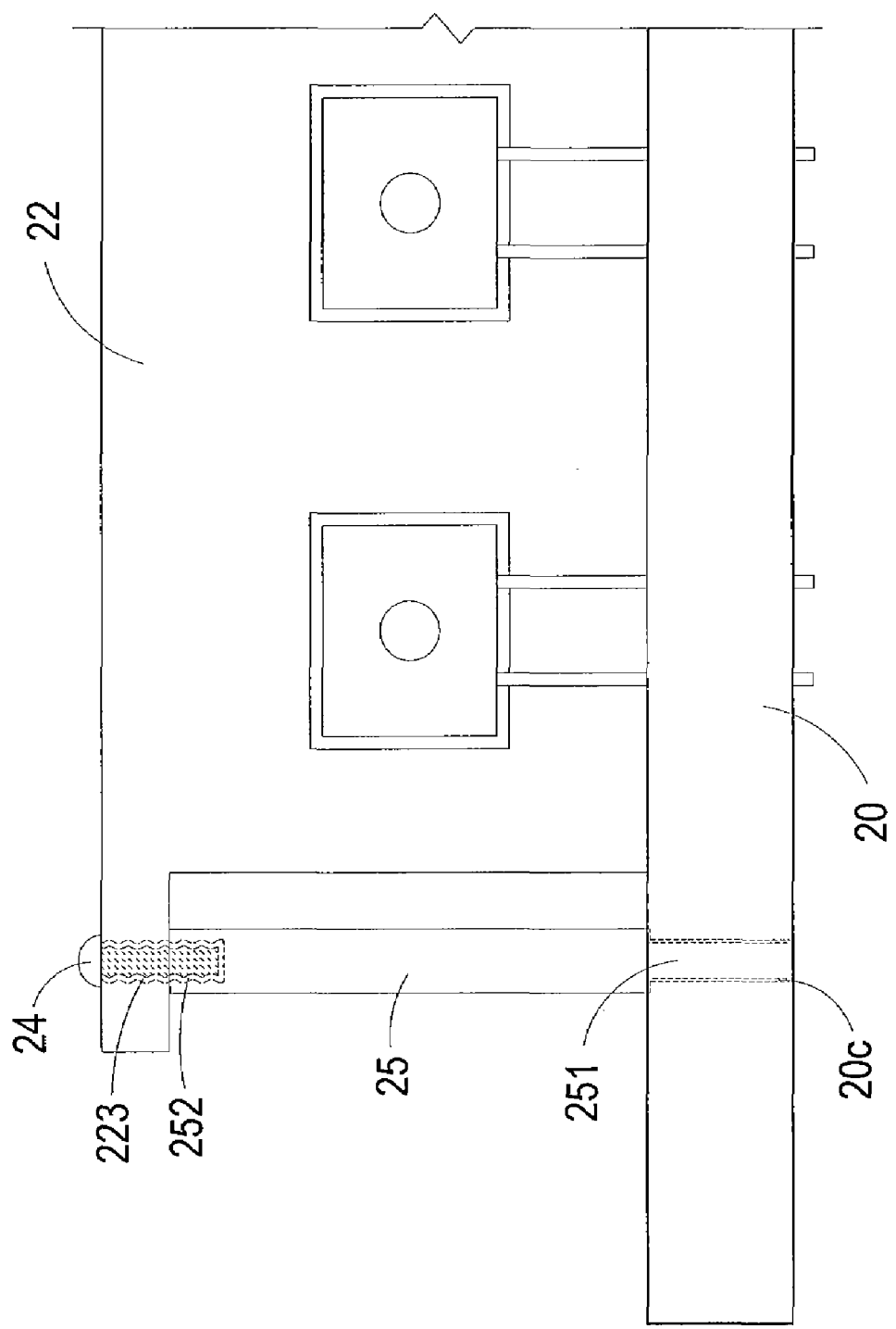
FIG. 5 is a partial schematic cross-sectional view of the circuit board shown in FIG. 4.

Please refer to FIG. 5, which is a partial schematic cross-sectional view of the circuit board shown in FIG. 4. The connecting member 25 includes a first connecting part 251 and a second connecting part 252. The first connecting part 251 is substantially a protrusion structure. The second connecting part 252 is a groove having inner threads formed on the inner wall thereof. The circuit board 20 has a first connecting portion 20c corresponding to the first connecting part 251 of the connecting member 25. An example of the first connecting portion 20c is also a perforation. In an embodiment, the first connecting part 251 of the connecting member 25 is coupled to the first connecting portion 20c of the circuit board 20 by riveting, so that the connecting member 25 is firmly fixed on the first surface 20a of the circuit board 20. For coupling the heat sink 22 with the circuit board 20, the fixing element 24 (e.g. a screw) is penetrated through the second connecting portion 223 (e.g. a perforation) of the heat sink 22 and then screwed in the second connecting part 252 (e.g. a groove), so that the heat sink 22 is fixed on the connecting member 25. Meanwhile, the heat sink 22 is firmly fixed on the first surface 20a of the circuit board 20 by means of the heat sink fastening device of the present invention.

In some embodiments, the connecting member 25 is made of metallic material or insulating material. Alternatively, the connecting member 25 may be connected to a ground contact (not shown) on the circuit board 20.

Figure 6:
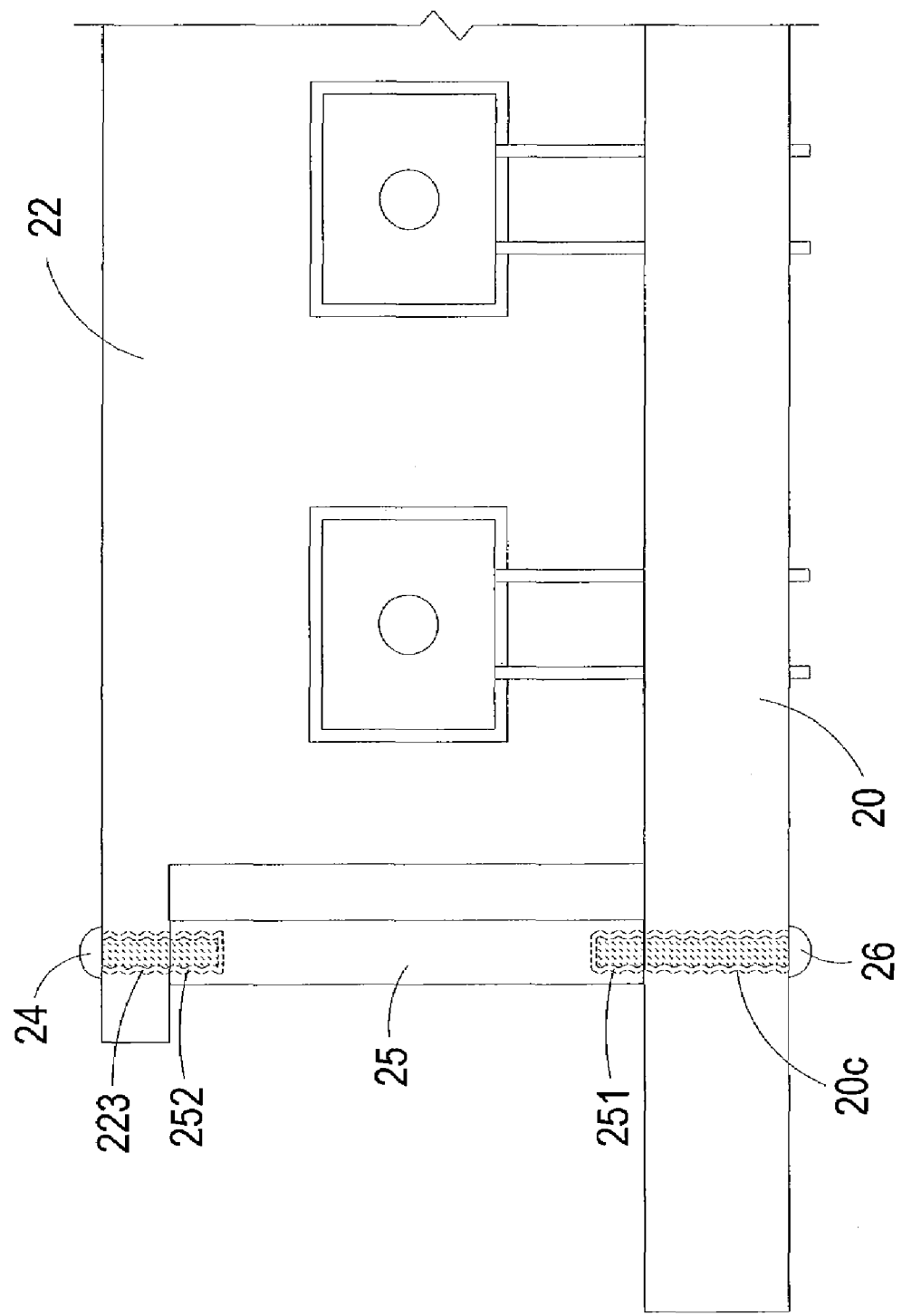
FIG. 6 is a schematic cross-sectional view illustrating a layout configuration of a circuit board according to another preferred embodiment of the present invention.

A further embodiment of a layout configuration of a circuit board is illustrated in FIG. 6. The heat sink fastening device of this embodiment principally includes a second connecting portion 223 of the heat sink 20, a first fixing element 24, a first connecting portion 20c of the circuit board 20, a connecting member 25 and a second fixing element 26. The connecting member 25 includes a first connecting part 251 and a second connecting part 252. The first connecting part 251 is a groove having inner threads formed on the inner wall thereof. The second connecting part 252 is also a groove having inner threads formed on the inner wall thereof. An example of the first connecting portion 20c is also a perforation. For coupling the heat sink 22 with the circuit board 20, the second fixing element 26 (e.g. a screw) is penetrated through the first connecting portion 20c (e.g. a perforation) of the circuit board 20 and then screwed in the first connecting part 251 (e.g. a groove), so that the heat sink 22 is fixed on the connecting member 25. The second connecting portion 223 is arranged at an edge of the second part 222 of the heat sink 22 and corresponding to the connecting member 25. For coupling the heat sink 22 with the circuit board 20, the first fixing element 24 (e.g. a screw) is penetrated through the second connecting portion 223 (e.g. a perforation) of the heat sink 22 and then screwed in the second connecting part 252 (e.g. a groove), so that the heat sink 22 is fixed on the connecting member 25. Meanwhile, the heat sink 22 is firmly fixed on the first surface 20a of the circuit board 20 by means of the heat sink fastening device of the present invention.

Hereinafter, a process of fixing the heat sink on the circuit board will be illustrated with reference to FIG. 7. First of all, a circuit board 20 including a first surface 20a, a second surface 20b and a first connecting portion 20c is provided, and a first connecting part 251 of a connecting member 25 is coupled to the first connecting portion 20c of the circuit board 20 (Step S31). Then, several electronic components 21 constituting a power converting circuit are disposed on the first surface 20a of the circuit board 20, and these electronic components 21 and the circuit board 20 are heated in a reflow furnace to melt the solder paste so as to bond the electronic components 21 onto the circuit board 20 (Step S32). Then, the second connecting portion 223 of the heat sink 22 is coupled to the second connecting part 252 of the connecting member 25, thereby fixing the heat sink 22 on the circuit board 20 (Step S33).

Alternatively, some high power electronic components 21, e.g. transistors, may be fastened onto the first part 221 of the heat sink 22 in order to increase heat-dissipating efficiency. During the procedure of fixing the heat sink 22 on the circuit board 20 (Step S33), the pins of the high power electronic components 21 are inserted into corresponding via holes 20d of the circuit board 20. Afterwards, these electronic components 21 and the circuit board 20 are heated in the reflow furnace again so as to bond the pins onto the circuit board 20.

From the above description, the heat sink fastening device of the present invention is capable of facilitating fixing a heat sink on a circuit board. Since the procedures of turning over and turning back the circuit board are omitted, the process of assembling the heat sink is simplified and time-saving. In addition, since the electronic components are mounted on the circuit board before the heat sink is fixed on the circuit board, the space between the second part of the heat sink and the circuit board will no longer become hindrance from mounting the electronic components. Furthermore, the procedures of successively inserting the pins into these via holes and fastening the high power electronic components are improved in order to simplify the assembling process.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat sink fastening device for facilitating fixing a heat sink on a circuit board, said circuit board including a first surface and a second surface, a plurality of electronic components being mounted on said first surface of said circuit board, said heat sink including a first part and a second part, wherein at least one of the electronic components is fastened onto said heat sink said second part of said heat sink being extended from an edge of said first part, said heat sink fastening device including:

a first connecting portion included in said circuit board;

a second connecting portion included in said second part of said heat sink; and at least a connecting member disposed on said first surface of said circuit board and including a first connecting part and a second connecting part, wherein said first connecting part is coupled to said first connecting portion of said circuit board and said second connecting part is coupled to said second connecting portion of said heat sink, thereby facilitating fixing said heat sink on said first surface of said circuit board.

2. The heat sink fastening device according to claim 1 wherein said heat sink is an aluminum extrusion element having an L-shaped or T-shaped cross-section.

3. The heat sink fastening device according to claim 1 wherein said first part and said second part of said heat sink are substantially perpendicular to each other.

4. The heat sink fastening device according to claim 1 wherein said first part of said heat sink is supported on said first surface of said circuit board, and said second part of said heat sink is substantially parallel with said circuit board such that a space is formed between said second part of said heat sink and said circuit board.

5. The heat sink fastening device according to claim 1 wherein the at least one electronic component fastened onto said first part of said heat sink is a high power electronic component.

6. The heat sink fastening device according to claim 1 wherein said second connecting portion of said heat sink is a perforation, and said second connecting part of said connecting member is a groove having inner threads formed on the inner wall thereof.

7. The heat sink fastening device according to claim 6 wherein said heat sink fastening device further comprises a first fixing element, which is penetrated through said second connecting portion of said heat sink and coupled to said second connecting part of said connecting member, so as to facilitate fixing said heat sink on said second connecting part of said connecting member.

8. The heat sink fastening device according to claim 1 wherein said first connecting portion of said circuit board is a perforation coupled to said first connecting part of said connecting member by riveting, so that said connecting member is fixed on said first surface of said circuit board.

9. The heat sink fastening device according to claim 1 wherein said first connecting portion of said circuit board is a perforation, and said first connecting part of said connecting member is a groove having inner threads formed on the inner wall thereof.

10. The heat sink fastening device according to claim 9 wherein said heat sink fastening device further comprises a second fixing element, which is penetrated through said first connecting portion of said circuit board and coupled to said first connecting part of said connecting member, so that said connecting member is fixed on said first surface of said circuit board.

11. The heat sink fastening device according to claim 1 wherein said connecting member is made of metallic material or insulating material.

12. A process of assembling a heat sink on a circuit board, comprising steps of:

providing a circuit board including a first surface, a second surface and a first connecting portion, a connecting member being disposed on said first surface of said circuit board and including a first connecting part and a second connecting part, wherein said first connecting part of said connecting member is coupled to said first connecting portion of said circuit board;

mounting a plurality of electronic components on said circuit board and heating said electronic components and said circuit board in a reflow furnace, thereby bonding said electronic components onto the circuit board; and providing a heat sink including a first part and a second part a connecting portion included in said second part of said heat sink, and coupling said second connecting portion of said heat sink to said second connecting part of said connecting member, thereby facilitating fixing said heat sink on said first surface of said circuit board wherein at least one electronic component is fastened onto said first part of said heat sink, said second part of said heat sink being extended from an edge of said first part.

13. The process according to claim 12 wherein said heat sink is an aluminum extrusion element having an L-shaped or T-shaped cross-section, and said connecting member is made of metallic material or insulating material.

14. The process according to claim 13 wherein said heat sink further includes a first part and a second part, which are substantially perpendicular to each other.

15. The process according to claim 14 wherein said first part of said heat sink is supported on said first surface of said circuit board, and said second part of said heat sink is substantially parallel with said circuit board such that a space is formed between said second part of said heat sink and said circuit board.

16. The process according to claim 12 wherein the at least one electronic component fastened onto said first part of said heat sink is a high power electronic component.

17. The process according to claim 12 wherein said second connecting portion of said heat sink is a perforation, and said second connecting part of said connecting member is a groove having inner threads formed on the inner wall thereof.

18. The process according to claim 17 wherein said heat sink fastening device further comprises a first fixing element, which is penetrated through said second connecting portion of said heat sink and coupled to said second connecting part of said connecting member, so as to facilitate fixing said heat sink on said second connecting portion of said heat sink.

19. The process according to claim 12 wherein said first connecting portion of said circuit board is a perforation, and said first connecting part of said connecting member is a groove having inner threads formed on the inner wall thereof.

20. The process according to claim 19 wherein said heat sink fastening device further comprises a second fixing element, which is penetrated through said first connecting portion of said circuit board and coupled to said first connecting part of said connecting member, so that said connecting member is fixed on said first surface of said circuit board.

* * * * *